US010024888B2

(12) United States Patent
Kumar et al.

(10) Patent No.: US 10,024,888 B2
(45) Date of Patent: Jul. 17, 2018

(54) DATA RECEIVING DEVICE INCLUDING AN ENVELOPE DETECTOR AND RELATED METHODS

(71) Applicant: STMicroelectronics International N.V., Schiphol (NL)

(72) Inventors: Daljeet Kumar, New Delhi (IN); Tapas Nandy, Delhi (IN); Surendra Kumar, Greater Noida (IN)

(73) Assignee: STMicroelectronics International N.V., Schiphol (NL)

(*) Notice: Subject to any disclaimer, the term of this patent is extended or adjusted under 35 U.S.C. 154(b) by 0 days.

(21) Appl. No.: 15/618,269

(22) Filed: Jun. 9, 2017

(65) Prior Publication Data

US 2017/0276710 A1    Sep. 28, 2017

Related U.S. Application Data

(63) Continuation of application No. 14/585,357, filed on Dec. 30, 2014, now Pat. No. 9,696,351.

(51) Int. Cl.
*G01R 19/04* (2006.01)
*G01R 19/25* (2006.01)

(52) U.S. Cl.
CPC ......... *G01R 19/04* (2013.01); *G01R 19/2503* (2013.01)

(58) Field of Classification Search
USPC ............ 375/340, 373, 139; 327/62; 324/522
See application file for complete search history.

(56) References Cited

U.S. PATENT DOCUMENTS

| 6,980,006 | B1* | 12/2005 | Nguyen | G01R 19/10 324/522 |
| 2003/0142773 | A1* | 7/2003 | Shirota | H03L 7/0814 375/373 |
| 2008/0182536 | A1* | 7/2008 | Ku | H03G 3/344 455/218 |
| 2010/0039141 | A1* | 2/2010 | Ou | G01R 19/04 327/62 |
| 2012/0314816 | A1* | 12/2012 | Hsieh | H04L 25/0292 375/340 |
| 2014/0073243 | A1* | 3/2014 | Hijioka | H04B 5/0031 455/41.1 |
| 2014/0084995 | A1 | 3/2014 | Hadji-Abdolhamid et al. | |
| 2015/0004661 | A1* | 1/2015 | Rhee | C12N 9/0008 435/126 |
| 2015/0136857 | A1 | 5/2015 | Pillin et al. | |
| 2016/0103781 | A1* | 4/2016 | Lin | G06F 13/4282 375/139 |
| 2016/0210973 | A1 | 7/2016 | Kim et al. | |
| 2017/0250663 | A1* | 8/2017 | Nakao | H03F 3/45233 |

\* cited by examiner

*Primary Examiner* — Eva Puente
(74) *Attorney, Agent, or Firm* — Slater Matsil, LLP

(57) ABSTRACT

A data receiving device may include an envelope detector that may include first and second inputs configured to receive a differential input signal, a first pair of detectors coupled to the first input and configured to generate first and second detector outputs, and a second pair of detectors coupled to the second input and configured to generate third and fourth detector outputs. The envelope detector may also include a logic circuit configured to generate a reset based upon the first and third detectors. The data receiving device may also include a receiver circuit coupled to the envelope detector and configured to generate an output based upon the second and fourth detectors along with the reset, and a first bit detection circuit coupled to the receiver circuit.

20 Claims, 7 Drawing Sheets

DATA RECEIVING DEVICE INCLUDING AN ENVELOPE DETECTOR AND RELATED METHODS

CROSS-REFERENCE TO RELATED APPLICATIONS

This application is a continuation of U.S. patent application Ser. No. 14/585,357 filed on Dec. 30, 2014, which application is hereby incorporated herein by reference.

TECHNICAL FIELD

The present invention relates to the field of electronic circuits, and, more particularly, to the detection of peak levels of a voltage signal used in such circuits and related methods.

BACKGROUND

A peak detector is an analog circuit adapted to detect the peak levels of a signal. A peak detector with a reset capability is commonly referred to as an envelope detector. Envelope detectors are widely used in gain control and spectral energy estimation. Many of the conventional envelope detectors can only operate at low to middle frequency bands, e.g., 1 kHz to 10 kHz, and low to middle data rate applications.

Envelope detectors can be used to generate an output signal representing the envelope level or amplitude of a high frequency input signal. This can be used in many applications, such as demodulating an amplitude modulated input signal, detecting the strength of a received radio frequency (RF) signal, detecting the level of a generated RF signal for use in amplitude leveling loops, detecting the level of a generated RF signal for use in an amplitude feedback loop such as in a polar modulator, or for other suitable applications.

Envelope detection circuitry is typically implemented in high speed serial communication circuitry such as, for example, that defined in accordance with the USB standard. Generally, an envelope detection circuitry in a high-speed serial link detects the envelope of the amplitude of the high frequency input signal and generates an output signal if the amplitude exceeds a threshold to differentiate from un-driven or tri-stated differential inputs.

SUMMARY

A data receiving device may include an envelope detector that may include first and second inputs configured to receive a differential input signal, a first pair of detectors coupled to the first input and configured to generate first and second detector outputs, and a second pair of detectors coupled to the second input and configured to generate third and fourth detector outputs. The envelope detector may also include a logic circuit configured to generate a reset based upon the first and third detectors. The data receiving device may also include a receiver circuit coupled to the envelope detector and configured to generate an output based upon the second and fourth detectors along with the reset, and a first bit detection circuit coupled to the receiver circuit.

The receiver circuit may include a negative threshold path configured to receive the second detector output and a positive threshold path configured to receive the fourth detector output. Each of the negative and positive threshold paths may include a flip flop controlled by the reset, for example.

The data receiving device may also include a respective pair of series coupled resistors coupled to each of the first and second pairs of detectors. The second and fourth detectors may each have a respective trigger voltage based upon the respective pair of series coupled resistors, for example.

The first bit detection circuit may be configured to generate an output based upon said first and third detectors, for example. The envelope detector may also include at least one current source coupled to the first and second pairs of detectors. The at least one current source may be a plurality of current sources coupled in parallel, for example. The plurality of current sources may include a fixed current source and a variable current source. The envelope detector may also include an amplifier coupled to the at least one current source.

A method aspect is directed to a method of making a data receiving device. The method includes forming an envelope detector. Forming the envelope detector may include coupling a first pair of detectors to a first input configured to receive a differential input signal, the first pair of detectors configured to generate first and second detector outputs, and coupling a second pair of detectors to a second input configured to receive a differential input, the second pair of detectors configured to generate third and fourth detector outputs. Forming the envelope detector may also include coupling a logic circuit to the first and third detectors for generating a reset based thereon. The method also includes coupling a receiver circuit to the envelope detector for generating an output based upon the second and fourth detectors along with the reset, and coupling a first bit detection circuit to the receiver circuit.

DETAILED DESCRIPTION OF ILLUSTRATIVE EMBODIMENTS

Figure 1:
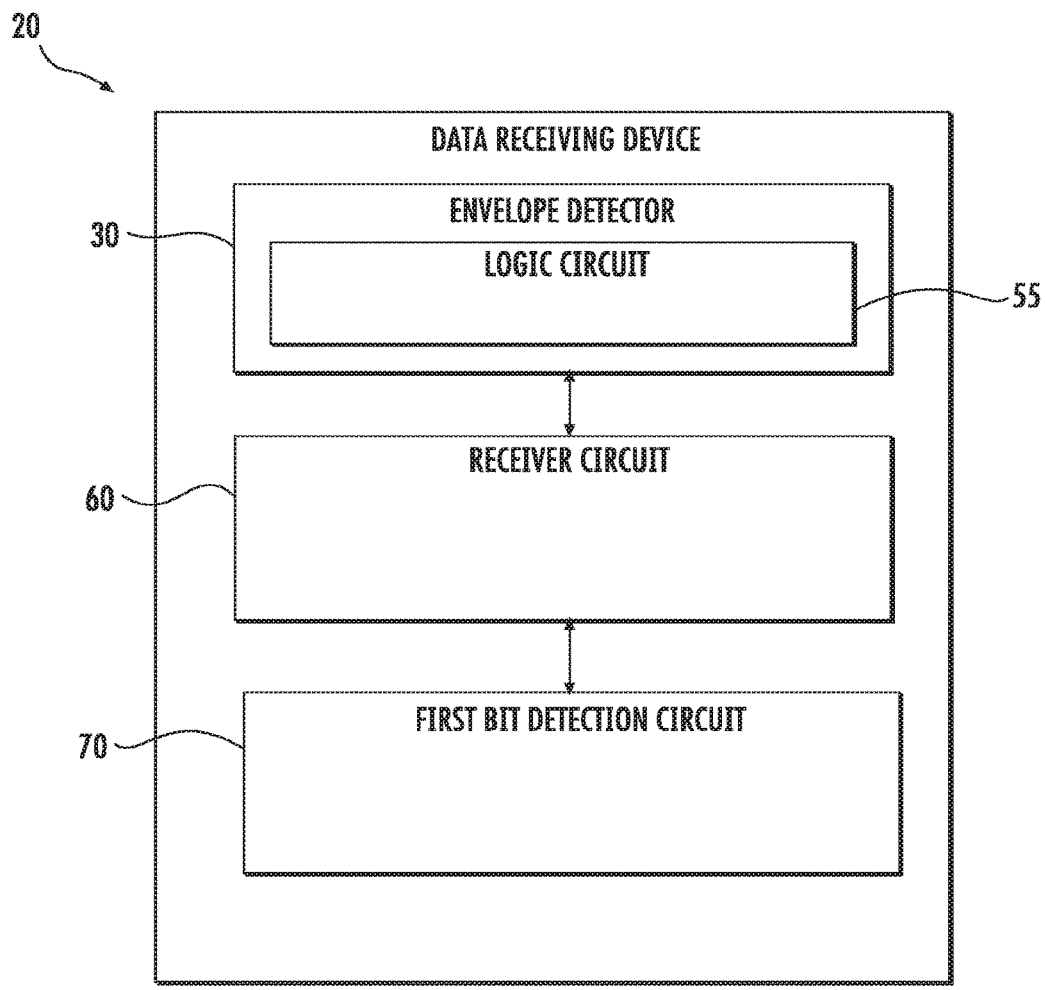
FIG. 1 is a schematic block diagram of a data receiving device according to an embodiment of the present invention.
Figure 2:
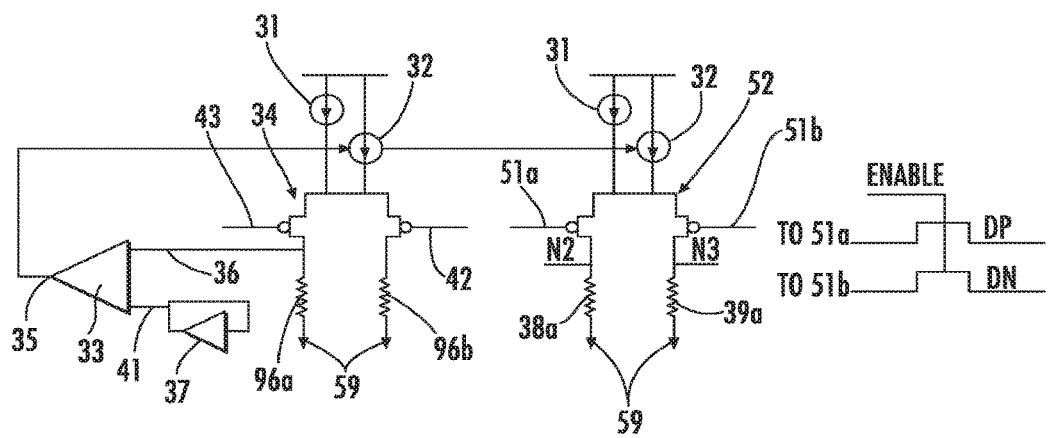
FIG. 2 is a schematic diagram of a portion of the envelope detector of the data receiving device of FIG. 1.
Figure 3:
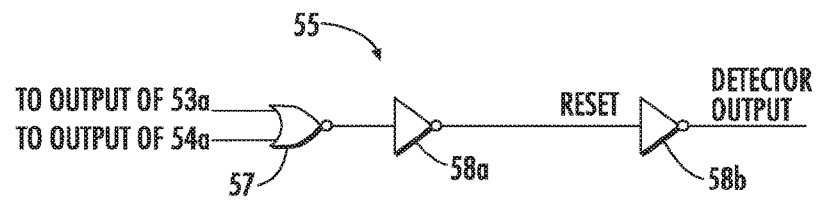
FIG. 3 is a schematic diagram of a logic circuit of the envelope detector of FIG. 1.
Figure 4:
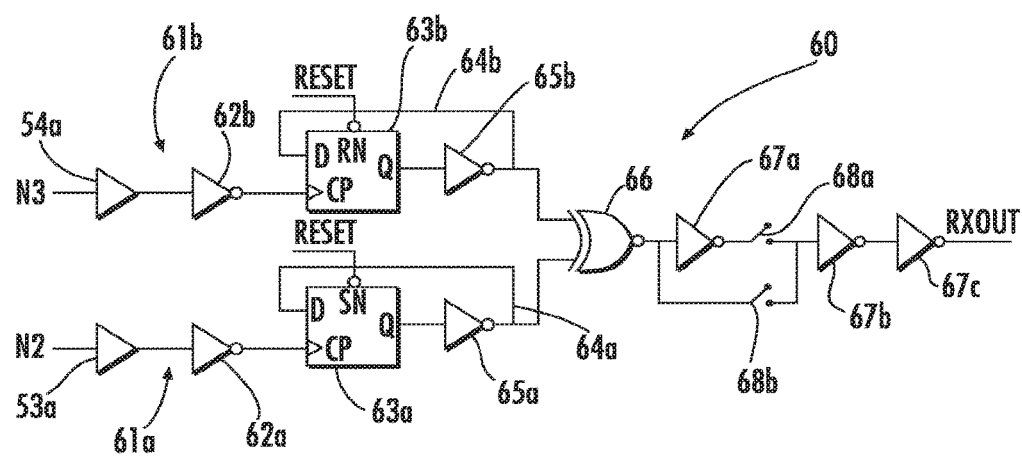
FIG. 4 is a schematic diagram of a receiver circuit of the data receiving device of FIG. 1.
Figure 5:
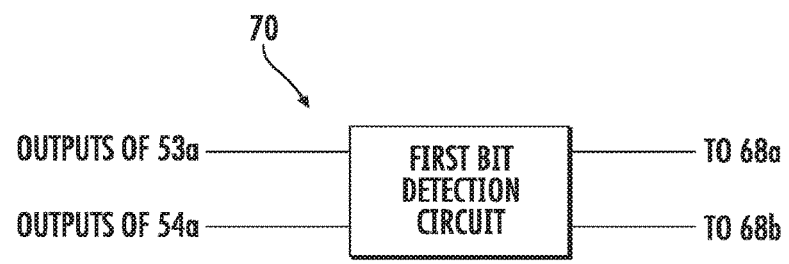
FIG. 5 is a schematic diagram of a first bit detection circuit of the data receiving device of FIG. 1.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout and prime and multiple prime notation is used to indicate like elements in different embodiments.

Referring to FIGS. 1-5, a data receiving device 20 illustratively includes an envelope detector 30. The data receiving device 20 may be part of a wireless communications device, for example, receiver circuitry of a mobile wireless communications device, and more particularly, a high-speed serial link device. The envelope detector 30 includes first and second current sources 31, 32. The first current source 31 may be a fixed current source, while the second current source 32 may be a variable current source. Of course, there may be more than one fixed and/or variable current source.

An operational transconductance amplifier (OTA) 33 is coupled to the variable current source 32. More particularly, an output 35 of the OTA 33 is coupled to the second current source 32. An input 36 of the OTA 33 is coupled to a reference differential amplifier 34 (e.g. first and second transistors). A replica reference detector 37, for example, an inverting amplifier, biased at its trip point is coupled to another input 41 of the OTA 33. The reference differential amplifier 34 is coupled to both the first and second current sources 31, 32. The reference differential amplifier 34 has first and second (positive and negative) inputs 42, 43 to receive negative (i.e., lower) and positive (i.e. higher) reference voltages respectively. Resistors 96a, 96b may be coupled between the reference differential amplifier 34 and a reference voltage 59, for example, a ground reference.

The envelope detector 30 includes first and second inputs 51a, 51b configured to receive a differential analog input signal at a data operational amplifier 52. The envelope detector 30 also includes a first detector 53a coupled to the first input 51a via node N2 and configured to generate a first detector output. The envelope detector 30 also includes a second detector 54a coupled to the second input 51b via node N3 and configured to generate a second detector output. First and second resistors 38a, 39a are coupled to the first and second detectors, respectively at nodes N2 and N3 and a reference voltage 59, for example, a ground reference.

The envelope detector 30 also illustratively includes a logic circuit 55 configured to generate a reset based upon an output of the first and second detectors 53a, 54a. More particularly, inputs of a logical NOR gate 57 are respectively coupled the outputs of the first and second detectors 53a, 54a. First and second inverters 58a, 58b are coupled in series to generate the reset signal and the detector output, respectively. In particular, the inverter 58a is coupled to the output of the logical NOR gate 57 to generate the reset signal, while the second inverter 58b receives the reset signal as an input and outputs the detector output.

The data receiving device 20 also includes a receiver circuit 60 coupled to the envelope detector 30 and configured to generate an output based upon the first and second detectors 53a, 54a along with the reset. The receiver circuit 60 illustratively includes a negative threshold path 61a configured to receive the output from the first detector 53a and is in parallel with a positive threshold path 61b configured to receive the output of the second detector 54a. Each of the negative and positive threshold paths 61a, 61b, includes a respective inverter 62a, 62b and a flip flop 63a, 63b coupled in series, for example, a D-type flip flop, controlled by the reset. Of course, each flip flop 63a, 63b may be another type of flip flop as will be appreciated by those skilled in the art. In other words, each of the negative and positive threshold paths 61a, 61b includes a detector (i.e., threshold detector) that is a replica of the replica reference detector 37 followed by another inverting stage. Each of the negative and positive threshold paths 61a, 61b also includes a second inverter 65a, 65b coupled to an output of the flip flop 63a, 63b, and a feedback loop 64a, 64b coupling an output of each second inverter to the flip flop input. The outputs of the second inverters 65a, 65b are also coupled to a logical exclusive NOR gate 66. The output of the logical exclusive NOR gate 66 is coupled to an inverter 67a and a second switch 68b. A first switch 68a is coupled the inverter 67a. In other words, the first and second switches 68a, 68b are coupled in parallel. Two additional inverters 67b, 67c are coupled in series with the parallel first and second switches 68a, 68b to generate the output signal. As will be appreciated by those skilled in the art, the first switch 68a may be ON or the second switch 68b may be ON based upon received data, for example the first received bit, the detection of which will be described in further detail below.

The data receiving device 20 also includes a first bit detection circuit 70 coupled to the receiver circuit 60. The first bit detection circuit 70 is configured to generate an output based upon the first and second detectors 53a, 54a. In other words, the first bit detection circuit, which has a pair of inputs, is coupled to the first and second detectors 53a, 54a (outputs) and the inputs of the logical NOR gate 57.

As will be appreciated by those skilled in the art, the envelope detector 30 may be particularly robust for detecting, with increased precision, the squelch threshold working at high speed. For example, the envelope detector 30 may detect the USB2 squelch threshold between 100 mV & 150 mV, i.e. only 50 mV of detection threshold, working at speed of 480 Mbps.

Depending upon the desired detection threshold, a fixed differential voltage is applied on the reference differential amplifier 34. To save the power, lower voltage is applied to the negative reference voltage input so that the negative feedback loop 35, which includes the OTA 33 and the reference differential amplifier 34, settles in comparatively low power. The differential amplifier 34 is biased with the first and second current sources 31, 32 i.e., the fixed and variable current sources respectively, controlled by the loop associated with the replica reference detector 37. This arrangement helps in maintaining all the transistors in saturation in all process, voltage, and temperature (PVT) conditions. The loop associated with the replica reference detector 37 settles the voltage input to the OTA 33 so that is may be precisely equal to the detector threshold (i.e., trip point).

Data (positive and negative) is inputted, via the first and second inputs 51a, 51b to the data differential amplifier 52 via an enable switch. Similar to the reference differential amplifier arrangement, to save power, the reference differential amplifier 34 can be biased at low current and the data differential amplifier 52 can also be biased by a scaled copy of the biasing current for the reference differential amplifier. The first and second detectors 53a, 54a, which as noted above are replicas of the reference detector 37, are coupled to the data differential amplifier 52. More particularly, the first and second detectors 53a, 54b each include two stages, the first stages of each of which are exact replicas of the reference detector 37 following by any inverting stage.

Consider the input data to the envelope detector 30 (positive=DP, negative=DN) in the table below.

TABLE 1

| | |
|---|---|
| \|DP-DN\| < detection threshold | N2 & N3 voltages are below the detector trip voltage. The output of both detectors = 0, → Squelch Condition |
| \|DP-DN\| = detection threshold & DP > DN | N3 voltage is precisely equal to the detector trip voltage. N2 voltage is below the detector trip voltage. |
| \|DP-DN\| = detection threshold & DN > DP | N2 voltage is precisely equal to the detector trip voltage. N3 voltage is below the detector trip voltage. |
| \|DP-DN\| > detection threshold &DP > DN | N3 voltage > detector trip point, the output of the second detector (positive) = High. N2 voltage < detector trip point, the output of the first detector (negative) = Low. → Non-Squelch Condition |
| \|DP-DN\| > detection threshold &DN > DP | N3 voltage < detector trip point, the output of the second detector (positive) = Low. N2 voltage > detector trip point, the output of the first detector (negative) = High. → Non-Squelch Condition |

It is desirable that the gain of the differential amplifier 34 be as low as possible so that with differential voltage at the input places the differential amplifier devices well into saturation, and so that when the data side differential voltage exceeds the reference side differential voltage, current is switched smoothly to have more precise detection. Here the envelope detector output can be used directly to indicate the line state of the data lines. The output of the receiver circuit (RXOUT) may only be available after the differential signal is above the detection threshold.

Detector architecture can be decided based on the technology and core voltage, as will be appreciated by those skilled in the art. The detector can be implemented as an inverter or a common source stage, for example, and based upon the gain achieved by one detector stage, more detector stages can be put in the data side section to amplify the signal and make it close to rail-to-rail.

Figure 6:
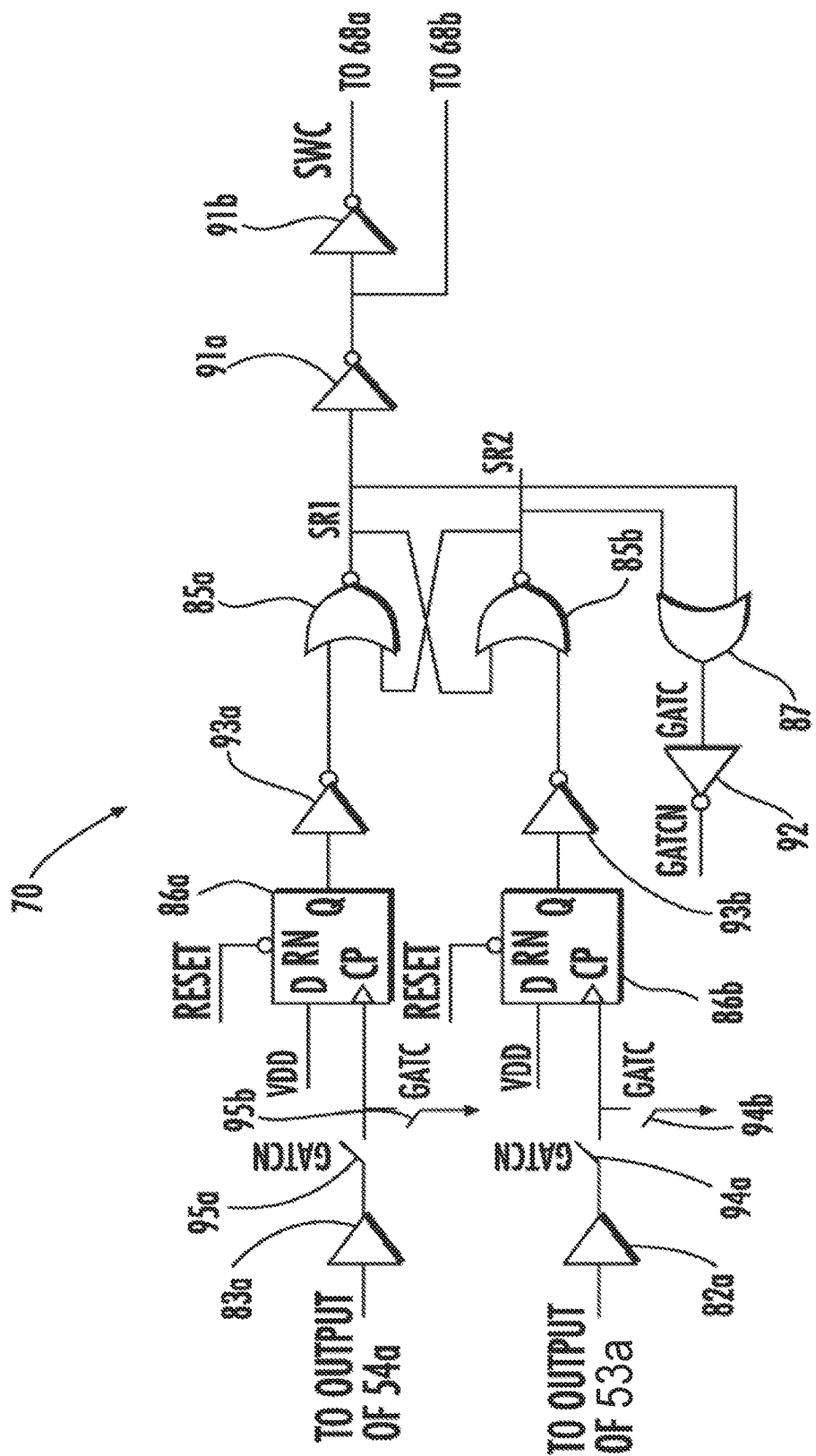
FIG. 6 is a more detailed schematic diagram of the first bit detection circuit of FIG. 5.

Referring now additionally to FIG. 6, an exemplary first bit detection circuit 70 and its operation are now described. Similar to the receiver circuit 60, the first bit detection circuit 70 may be set to a disable or reset state until the time differential signal or the data inputted via the first and second inputs 51a, 51b to the data differential amplifier 53 via an enable switch, first crosses the envelope detector threshold. On the positive edge of the outputs of the first and second detectors 53a, 54a, RESET is disabled. The first bit detection circuit 70 detects the first positive going transition on the outputs of the first and second detectors 53a, 54a, but is removed from the disabled state on the same positive edge of outputs of the first and second detectors. Thus, it may be desirable to delay the output signals of the first and second detectors 53a, 54a. This may be accomplished using respective delay elements 82a, 83a so that when RESET is disabled, for example, a positive edge of any of the detectors 53a, 54a comes afterwards. It may be particularly important that the RESET of the first bit detection circuit 70 be disabled because of the output signals from the first and second detectors 53a, 54a. The first bit detection circuit 70 detects which of the outputs of the first and second detectors 53a, 54a toggles first to determine the correct polarity of the output (RXOUT) of the receiver circuit 60. Thus, the delay elements 82a, 83a should be sufficient so that the first edge of output signals from the first and second detectors 53a, 54a is not missed. During the disabled state, SR latch outputs (i.e., outputs of the cross-coupled NOR gates 85a, 85b) are forced to zero enabling the pass gate at the inputs of the flip-flops 86a, 86b.

Once RESET is disabled, if the output of the second detector 54a toggles first, the output of the NOR gate 85a goes to 1 and the output of the NOR gate 85b goes to 0 the output of the first bit detection circuit 70 equals 1, an output of an OR gate 87 (GATC) having inputs coupled to the outputs of the first and second NOR gates 85a, 85b goes to 1, and the inputs to both flip flops 86a, 86b are disabled for rest of the data packet.

Similarly if the output of the first detector 53a toggles first, the output of the NOR gate 85a goes to 0, the output of the NOR gate 85b goes to 1, which makes the output of the first bit detection circuit 70 become 0, and the output of the OR gate 87 become 1, and the inputs to the flip-flops 86a, 86b are disabled for the rest of the data packet. The output signal of the first bit detection circuit 70 advantageously selects the correct polarity of the output signal (RXOUT) of the receiver circuit 60 based upon the first bit.

The first bit detection circuit 70 also includes series coupled inverters 91a, 91b coupled to the NOR gate 85a. Another inverter 92 is coupled to the output of the OR gate 87 and whose output (GATCN) is provided to the switches described below. A respective inverter 93a, 93b is also coupled between each flip-flop 86a, 86b and each NOR gate 85a, 85b that defines the SR latch. Respective switches 94a, 94b, 95a, 95b are coupled between the delay elements 83a, 83b and the flip flops 86a, 86b.

Figure 7:
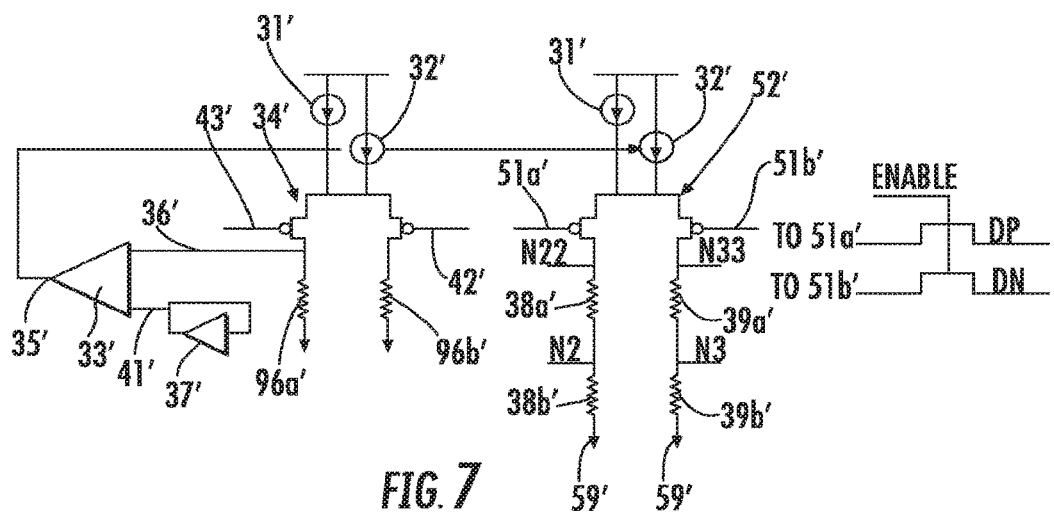
FIG. 7 is a schematic diagram of a portion of envelope detector of the data receiving device of FIG. 1 in accordance with another embodiment.
Figure 8:
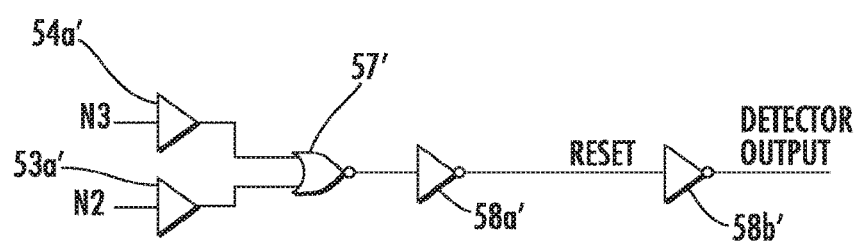
FIG. 8 is a schematic diagram of a logic circuit of the envelope detector of FIG. 7.
Figure 9:
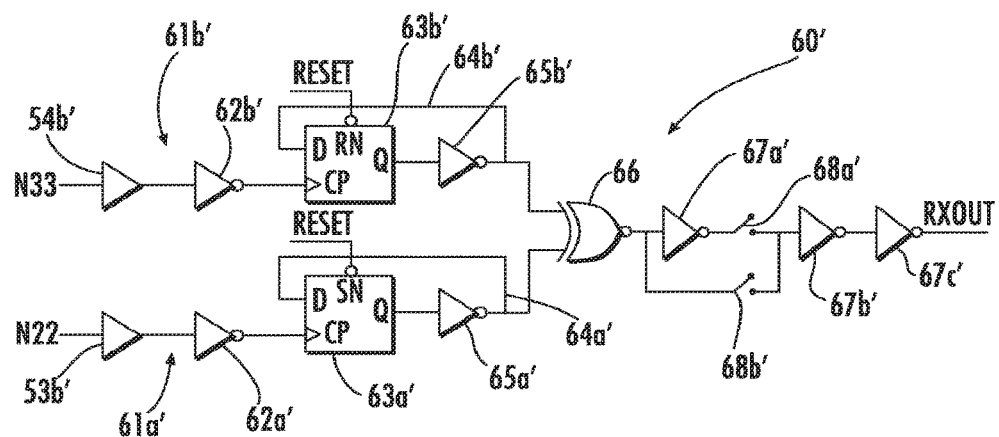
FIG. 9 is a schematic diagram of a receiver circuit for use with the envelope detector of FIG. 7.

Referring now to FIGS. 7-9, in another embodiment the envelope detector 30' includes first and second inputs 51a', 51b' configured to receive a differential analog input signal at a data operational amplifier 52'. The envelope detector 30' also includes a first pair of detectors 53a', 53b' coupled to the first input 51a' and configured to generate first and second detector outputs. The envelope detector 30' also includes a second pair of detectors 54a', 54b' coupled to the second input 51b' and configured to generate third and fourth detector outputs. Respective pairs of series coupled resistors 38a', 38b', 39a', 39b' are coupled between the data differential amplifier 52' a reference voltage 59', for example, a ground reference defining nodes N22 and N2, and, N33 and N3. A trigger voltage of the second and fourth detectors 53b', 54b' is based upon the respective pair of series coupled resistors.

The envelope detector 30' also illustratively includes a logic circuit 55' configured to generate a reset based upon the first and third detectors 53a', 54a'. The logic circuit 55' includes inputs that are coupled to the first and third detectors 53a', 54a', each of which may be in the form a respective threshold detector whose first inverting stage is a replica of the reference detector 37' followed by another inverting stage. Inputs of a logical NOR gate 57' are coupled to the outputs of the first and third detectors 53a', 54a'. First and second inverters 58a', 58b' are coupled in series to generate the reset signal and the detector output, respectively. The second inverter 58b' receives as input the reset signal and outputs a detector output signal.

The data receiving device 20' also includes a receiver circuit 60' coupled to the envelope detector 30' and configured to generate an output based upon the second and fourth detectors 53b', 54b' along with the reset. The receiver circuit 60' is similar to that described above and with respect to embodiment illustrated in FIG. 4. The data receiving device 20' also includes a first bit detection circuit 70' coupled to the receiver circuit 60'. The first bit detection circuit 70' is similar to that described above and with respect to the embodiment illustrated in FIGS. 5 and 6. Other circuitry illustrated but not specifically described with respect to the present embodiment is similar to that described above.

As will be appreciated by those skilled in the art, the envelope detector 30' may be particularly robust for detecting, with increased precision, the squelch threshold working at high speed. For example, the envelope detector 30' may detect the USB2 squelch threshold between 100 mV & 150 mV, i.e. only 50 mV of detection threshold, working at speed of 480 Mbps.

Depending upon the desired detection threshold, a fixed differential voltage is applied on the reference differential amplifier 34'. To save power, lower reference voltage is applied to the negative reference voltage input, so that the negative feedback loop 35' settles in comparatively low power. The differential amplifier 34' is biased with the first and second current sources 31', 32 i.e., the fixed and variable current sources respectively, controlled by the loop associated with the negative feedback loop 35'. This arrangement helps in maintaining all the transistors in saturation in all process, voltage, and temperature (PVT) conditions. The negative feedback loop 35', which includes the OTA 33' and the reference differential amplifier 34' settles the voltage input 36' to the OTA 33' so that it may be equal to the detector threshold.

Data (positive and negative) is inputted, via the first and second inputs 51a', 51b' to the data differential amplifier 52' via an enable switch. Similar to the reference differential amplifier arrangement, to save power, the reference differential amplifier 34' can be biased at low current and the data differential amplifier 52' can also be biased by a scaled copy of the biasing current for the reference differential amplifier. The first and second pairs of detectors 53a', 53b', 54a', 54b' are coupled to the data differential amplifier 52'.

Indeed, illustratively separate detector stages are used to generate the output signal, which triggers at a somewhat lower differential voltage then the differential voltage at which envelope detector triggers. This is achieved by the series coupled resistors 38a', 38b', 39a', 39b'. A voltage at the second and fourth detectors 53b', 54b' crosses the detector threshold voltage at a lower input differential voltage. The first and third detectors 53a', 54a' trigger at the same differential voltage as the reference differential amplifier side. The input differential voltage at which the second and fourth detectors 53b', 54b' "trip" is based upon the values of the series coupled resistors 38a', 38b', 39a', 39b'. It should be understood that it may be possible to place "taps" at different locations on the resistor ladder below the second and fourth detectors 53b', 54b' and use multiple detectors, as illustrated in FIG. 8 to obtain multiple envelope detection from the same circuit.

The data receiving device 20' also includes a receiver circuit 60'. The receiver circuit 60' is coupled to the envelope detector 30' and configured to generate an output based upon the second and fourth detectors 53b', 54b' along with the reset. The receiver circuit 60' illustratively includes a negative threshold path 61a' configured to receive the output from the second detector 53b' and is in parallel with a positive threshold path 61b' configured to receive the output of the fourth detector 54b'. Operation of the remainder of the receiver circuit 60' is similar to that described above with respect to FIG. 4.

The first bit detection circuit 70' cooperates with the first and third detectors 53a', 54a' only as the reset to the first bit detection circuit comes from the first and third detectors.

And, if the first bit detection circuit 70' enables operation of the second and fourth detectors 53b', 54b', the first bit may be missed during a relatively slow differential input waveform, for example. With this implementation, a better duty cycle may be achieved with respect to the second and fourth detectors 53b', 54b', and hence improved operation of the flip flops 63a', 63b'.

Figure 10:
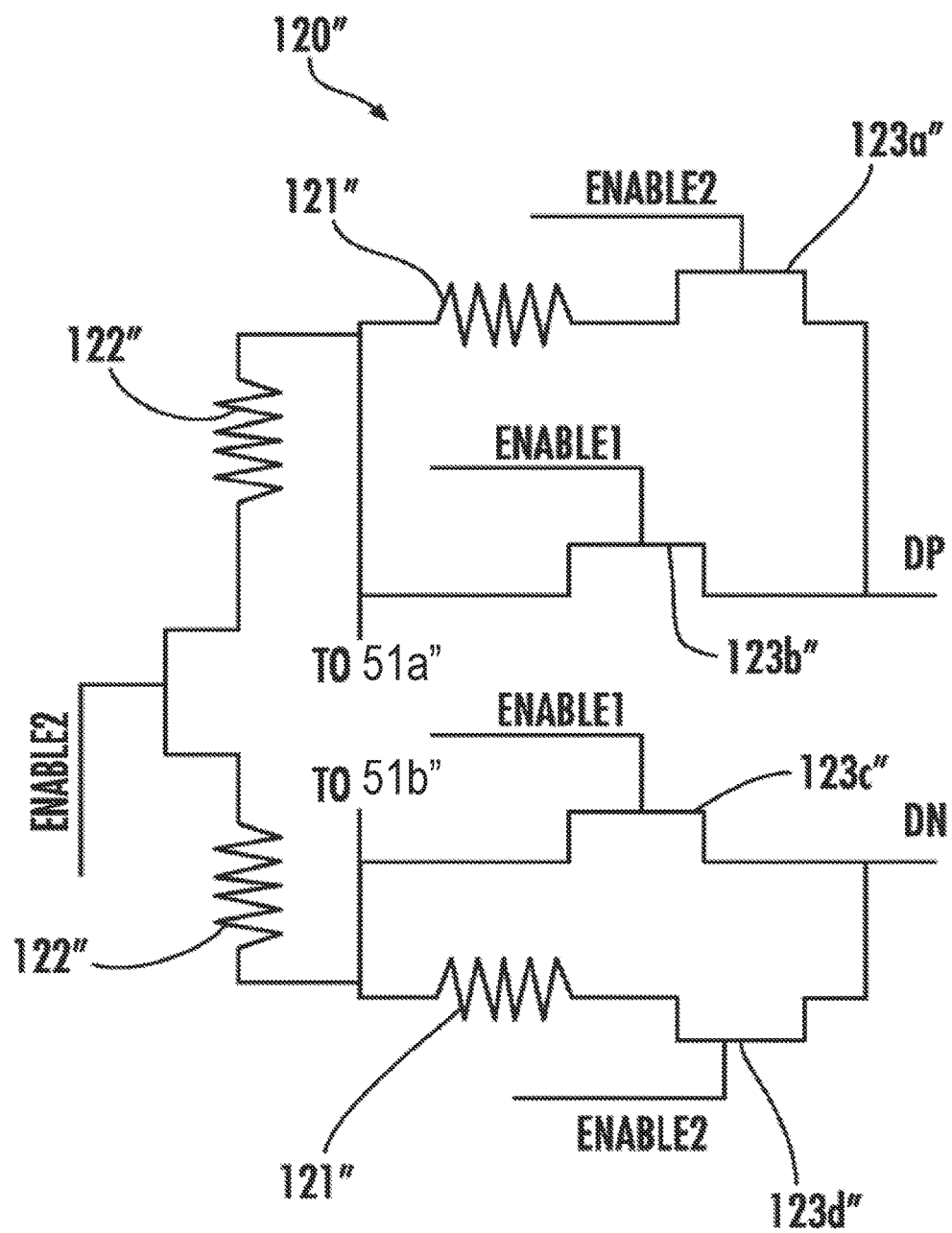
FIG. 10 is a schematic diagram of a portion of an envelope detector in accordance with another embodiment.

Referring additionally to FIG. 10, in another embodiment, the envelope detector 30" is configured to detect relatively high differential input conditions. In some instances, it may be desirable to detect a low frequency high differential input condition on the data lines, for example a disconnect condition in the USB2 protocol. As will be described in further detail below, with the addition of circuitry to the embodiment described above with respect to FIG. 2-5, for example, the low frequency high differential input condition on data lines may more easily be detected and with little disruption of the high frequency low differential input receive/squelch conditions.

In the present embodiment, the input differential signal is divided using the circuit 120" as it is applied to the envelope detector 30". First and second resistor pairs 121", 122" are relatively high-value resistors which generally do not load the inputs 51a", 51b". Generally, the only extra loading seen will be that of the extra pass gate 123a", 123c" (controlled by ENABLE2), and passed on directly to the nodes coupled to the positive and negative input data (DP/DN). Moreover, the added pass gates 123a"-123d" are also of a relatively small size as they are used to detect low frequency high differential input conditions. In this case, ENABLE1 shall be OFF. In other words, the pass gates controlled by ENABLE2 should be of such a relatively small size for detecting high differential conditions, for example.

The values of the first and second resistor pairs 121", 122" determine the input differential division, and corresponding adjustment in voltages at the inputs 42", 43" of the references differential amplifier 34" may be performed to detect the high differential input conditions, for example. In this embodiment, for dividing the input differential signal, a relatively small amount current is passed between the positive and negative input data to the envelope detector (DP, DN), which may not be a large concern in view of the high drive of the transmitter driving the data lines. And with this resistive division arrangement, a more accurate precise division of the input differential signal may be obtained, which is desired for precise detection threshold.

The present embodiment may be particularly advantageous for detecting a USB2 disconnect at a 575 mV detection threshold. Here the envelope detector output can be used directly to indicate a disconnect condition. In particular, the disconnect condition may be shown by further inverter (not shown) coupling in series with the second detector of the logic circuit. In other words, the further inverter receives as an input the detector output or the output of the second inverter and outputs a second detector output indicative of the disconnect condition. The output of the receiver circuit 60" (RXOUT) may be masked in some embodiments, as it may not be needed, for example, for USB2 disconnect detection.

A method aspect is directed to a method of making a data receiving device 20. The method includes forming an envelope detector 30 includes coupling a first pair of detectors 53a, 53b to a first input 51a configured to receive a differential input signal. The first pair of detectors 53a, 53b is configured to generate first and second detector outputs. Forming the envelope detector 30 also includes coupling a second pair of detectors 54a, 54b to a second input configured to receive a differential input. The second pair of detectors 54a, 54b is configured to generate third and fourth detector outputs. Forming the envelope detector 30 also includes coupling a logic circuit 55 to the first and third detectors 53a, 54a for generating a reset based thereon. The method also includes coupling a receiver circuit 60 to the envelope detector 30 for generating an output based upon the second and fourth detectors 53b, 54b along with the reset. The method further includes coupling a first bit detection circuit 70 to the receiver circuit 60.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

What is claimed is:

1. A circuit comprising:
    an envelope detector circuit configured to receive a pair of differential signals, the envelope detector circuit comprising:
        a first input node configured to receive a first signal of the pair of differential signals,
        a second input node configured to receive a second signal of the pair of differential signals,
        a reference differential amplifier having a pair of differential inputs configured to receive a pair of fixed voltage signals, the reference differential amplifier configured to be biased with a first bias current,
        a data differential amplifier coupled to the first input node and to the second input node, the data differential amplifier configured to be biased with a second bias current, the second bias current being a scaled copy of the first bias current,
        a first detector circuit coupled to a first output of the data differential amplifier,
        a second detector circuit coupled to a second output of the data differential amplifier; and
    a receiver circuit coupled to the envelope detector circuit and configured to generate an output based on an output of the first detector circuit and based on an output of the second detector circuit.

2. The circuit of claim 1, wherein the pair of differential signals are USB signals.

3. The circuit of claim 1, further comprising a logic circuit coupled to the output of the first detector circuit and to the output of the second detector circuit, the logic circuit configured to generate a reset signal in a reset node coupled to the receiver circuit.

4. The circuit of claim 1, further comprising a reference detector circuit coupled to a first current source, the first current source configured to generate the first bias current.

5. The circuit of claim 4, wherein the first detector circuit and the second detector circuit are replicas of the reference detector circuit.

6. The circuit of claim 1, wherein the envelope detector circuit further comprises:
    a first resistor coupled between the first output of the data differential amplifier and a reference node; and
    a second resistor coupled between the second output of the data differential amplifier and the reference node.

7. The circuit of claim 6, wherein the reference node is coupled to a ground reference.

8. The circuit of claim 6, wherein the envelope detector circuit further comprises:
    a third resistor coupled in series with the first resistor; and
    a fourth resistor coupled in series with the second resistor.

9. The circuit of claim 8, further comprising a first bit detection circuit coupled to the first input node and to the second input node, the first bit detection circuit configured to select a polarity of an output of the receiver circuit based on a first bit.

10. The circuit of claim 9, wherein the envelope detector circuit further comprises a logic circuit having a first input coupled to a first intermediate node and a second input coupled to a second intermediate node, the first intermediate node coupled between the first resistor and the third resistor, and the second intermediate node coupled between the second resistor and the fourth resistor, wherein the logic circuit is configured to generate a reset signal in a reset node coupled to the receiver circuit.

11. The circuit of claim 1, wherein the envelope detector circuit further comprises a differential voltage dividing circuit coupled to the first input node and to the second input node, the differential voltage dividing circuit configured to receive the pair of differential signals.

12. A method comprising:
    receiving a pair of differential signals with a data differential amplifier biased with a second bias current, the second bias current being a scaled copy of a first bias current used to bias a reference differential amplifier configured to receive a pair of fixed voltage signals;
    controlling the first bias current with a reference circuit comprising a reference detector circuit; and
    generating an output based on an output of a first detector circuit and based on an output of a second detector circuit, wherein
        the first detector circuit is coupled to a first output of the data differential amplifier, and
        the second detector circuit is coupled to a second output of the data differential amplifier.

13. The method of claim 12, wherein the pair of differential signals operate at a speed of 480 Mbps.

14. The method of claim 12, wherein the first detector circuit and the second detector circuit are replicas of the reference detector circuit.

15. A USB data receiver device comprising:
    an envelope detector circuit comprising
        first and second inputs configured to receive a differential input signal,
        a first detector circuit coupled to the first input, and
        a second detector circuit coupled to the second input;
    a logic circuit coupled to an output of the first detector circuit and to an output of the second detector circuit, the logic circuit configured to generate a reset signal based upon the first and second detector circuits; and
    a receiver circuit coupled to the envelope detector circuit and configured to generate an output based upon an output of the first detector circuit, an output of the second detector circuit, and the reset signal.

16. The USB data receiver device of claim 15, further comprising a first bit detection circuit coupled to the receiver circuit.

17. The USB data receiver device of claim 15, wherein the envelope detector circuit further comprises:
    a reference differential amplifier having a pair of differential inputs configured to receive a pair of fixed voltage signals, the reference differential amplifier configured to be biased with a first bias current; and
    a data differential amplifier coupled to the first input and to the second input, the data differential amplifier configured to be biased with a second bias current, the second bias current being a scaled copy of the first bias current.

18. The USB data receiver device of claim 17, wherein the envelope detector circuit further comprises a reference detector circuit coupled to a first current source, the first current source configured to generate the first bias current.

19. The USB data receiver device of claim 18, wherein the first detector circuit and the second detector circuit are replicas of the reference detector circuit.

20. The USB data receiver device of claim 17, wherein the envelope detector circuit further comprises:
- a first resistor coupled between a first output of the data differential amplifier and a reference node; and
- a second resistor coupled between a second output of the data differential amplifier and the reference node.

* * * * *